US011282766B2

United States Patent
Ku et al.

(10) Patent No.: US 11,282,766 B2
(45) Date of Patent: Mar. 22, 2022

(54) PACKAGE STRUCTURE

(71) Applicant: Taiwan Semiconductor Manufacturing Co., Ltd., Hsinchu (TW)

(72) Inventors: Shih-Chang Ku, Taipei (TW); Wensen Hung, Hsinchu County (TW); Hung-Chi Li, Taipei (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 247 days.

(21) Appl. No.: 16/737,832

(22) Filed: Jan. 8, 2020

(65) Prior Publication Data
US 2021/0098333 A1 Apr. 1, 2021

Related U.S. Application Data

(60) Provisional application No. 62/906,727, filed on Sep. 27, 2019.

(51) Int. Cl.
*H01L 23/40* (2006.01)
*H01L 23/473* (2006.01)
*H01L 23/00* (2006.01)

(52) U.S. Cl.
CPC ........ *H01L 23/4006* (2013.01); *H01L 23/473* (2013.01); *H01L 24/29* (2013.01); *H01L 2023/4025* (2013.01); *H01L 2023/4087* (2013.01)

(58) Field of Classification Search
None
See application file for complete search history.

(56) References Cited

U.S. PATENT DOCUMENTS

2013/0314877 A1* 11/2013 Watanabe ............ H05K 1/0203
361/719
2018/0366437 A1* 12/2018 Chen ...................... H01L 23/467

* cited by examiner

*Primary Examiner* — Evren Seven
(74) *Attorney, Agent, or Firm* — JCIPRNET

(57) ABSTRACT

A package structure including a reconstructed wafer, a heat dissipation substrate, a semiconductor device, and a fixing mechanism is provided. The heat dissipation substrate is disposed on a side of the reconstructed wafer and includes an inlet, a base plate located between the inlet and the reconstructed wafer, and a connection member located and coupled between the inlet and the base plate. The connection member has an inclined fluid channel that descends from the inlet to the base plate. The semiconductor device is disposed on another side of the reconstructed wafer, wherein the heat dissipation substrate and the semiconductor device are respectively located on opposite sides of the reconstructed wafer. The fixing mechanism fixes the reconstructed wafer, the heat dissipation substrate, and the semiconductor device together.

20 Claims, 13 Drawing Sheets

PACKAGE STRUCTURE

PRIORITY CLAIM AND CROSS-REFERENCE

This application claims the benefit of U.S. Provisional Application No. 62/906,727, filed on Sep. 27, 2019, which application is hereby incorporated herein by reference.

BACKGROUND

A typical problem with miniaturization of semiconductor devices is heat dissipation during operation. A prolonged exposure of a die by operating at excessive temperatures may decrease the reliability and lifetime of the die. This problem may become severe if the die is a computing die such as a central processing unit (CPU), which generates a lot of heat. As such, improvements to heat transfer are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1A:
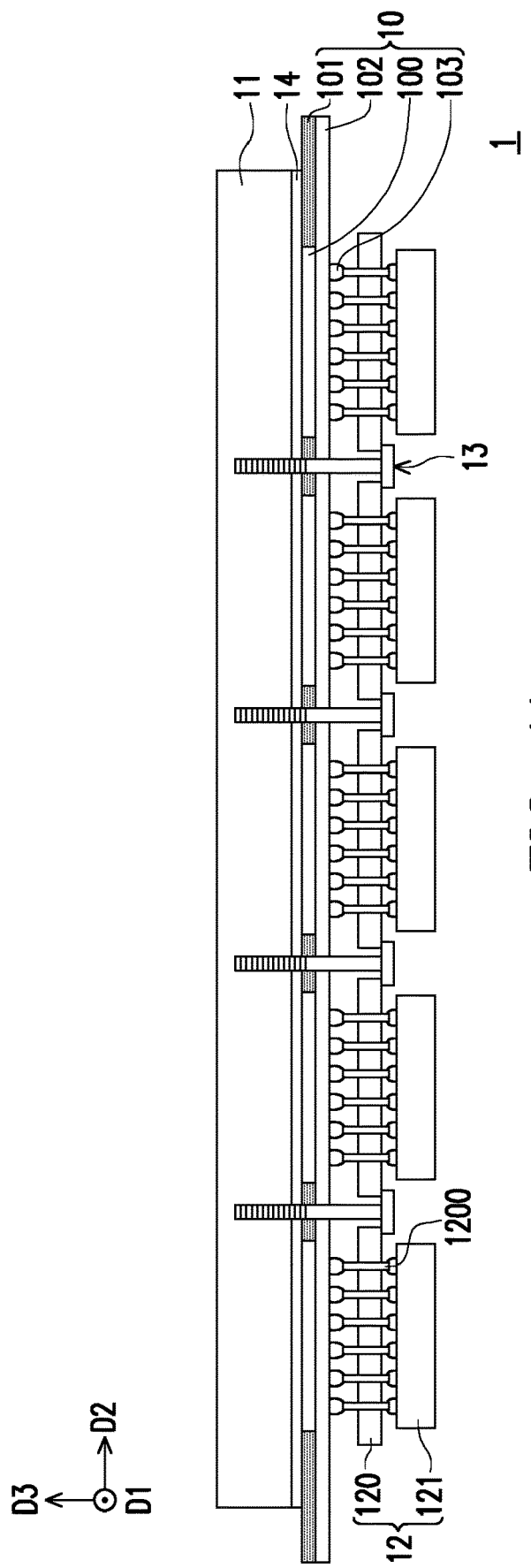
FIG. 1A schematically illustrates a cross-sectional view of a package structure in accordance with some embodiments of the present disclosure.

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
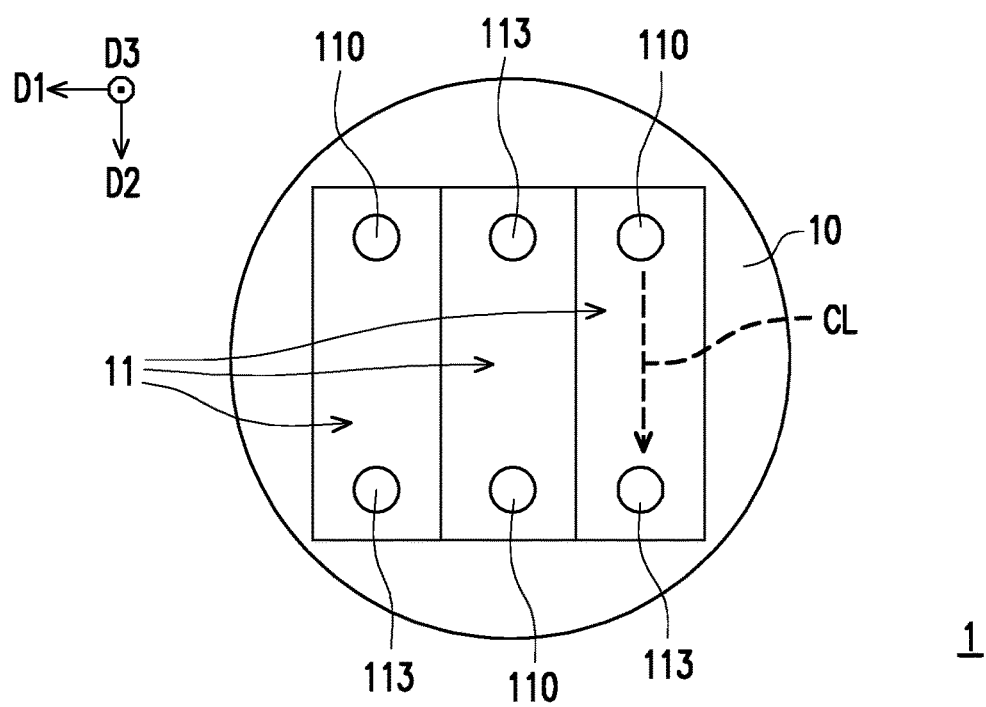
FIG. 1B schematically illustrates a top view of the package structure in FIG. 1A.
Figure 1C:
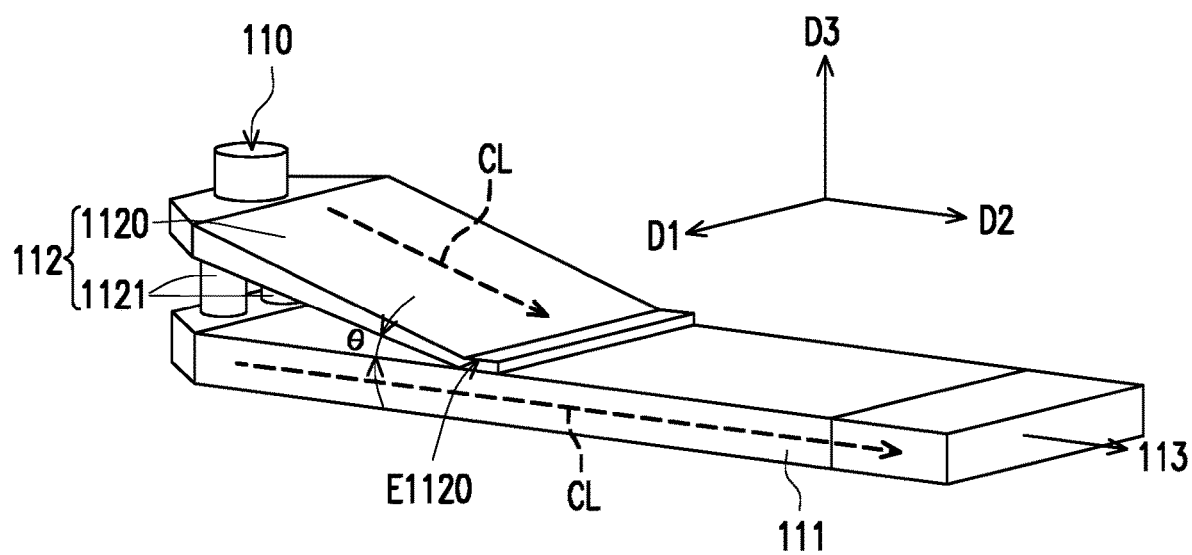
FIG. 1C schematically illustrates a stereo view of a heat dissipation substrate in FIG. 1B.
Figure 1D:
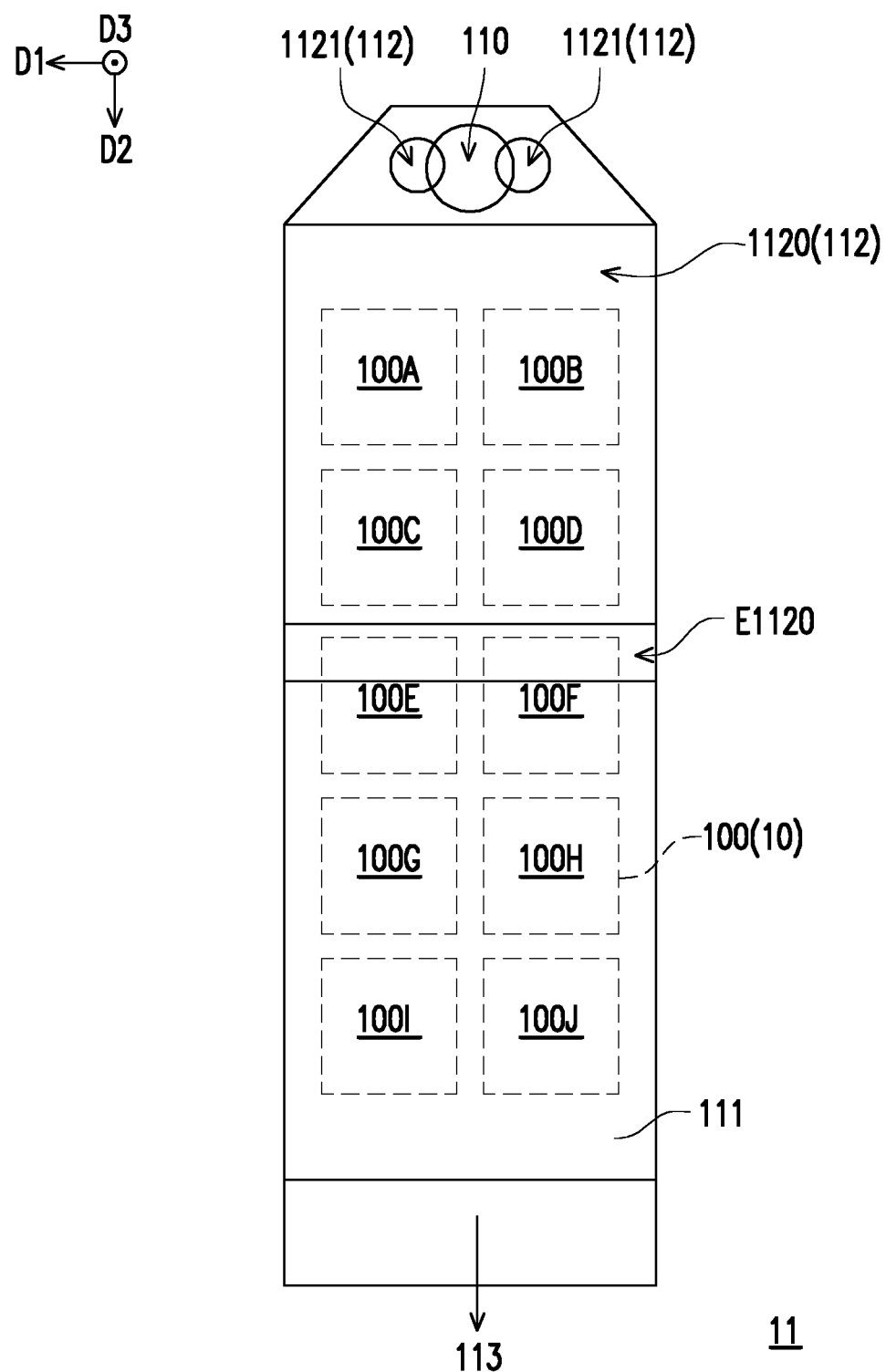
FIG. 1D schematically illustrates a detailed top view of the heat dissipation substrate in FIG. 1C.
Figure 1E:
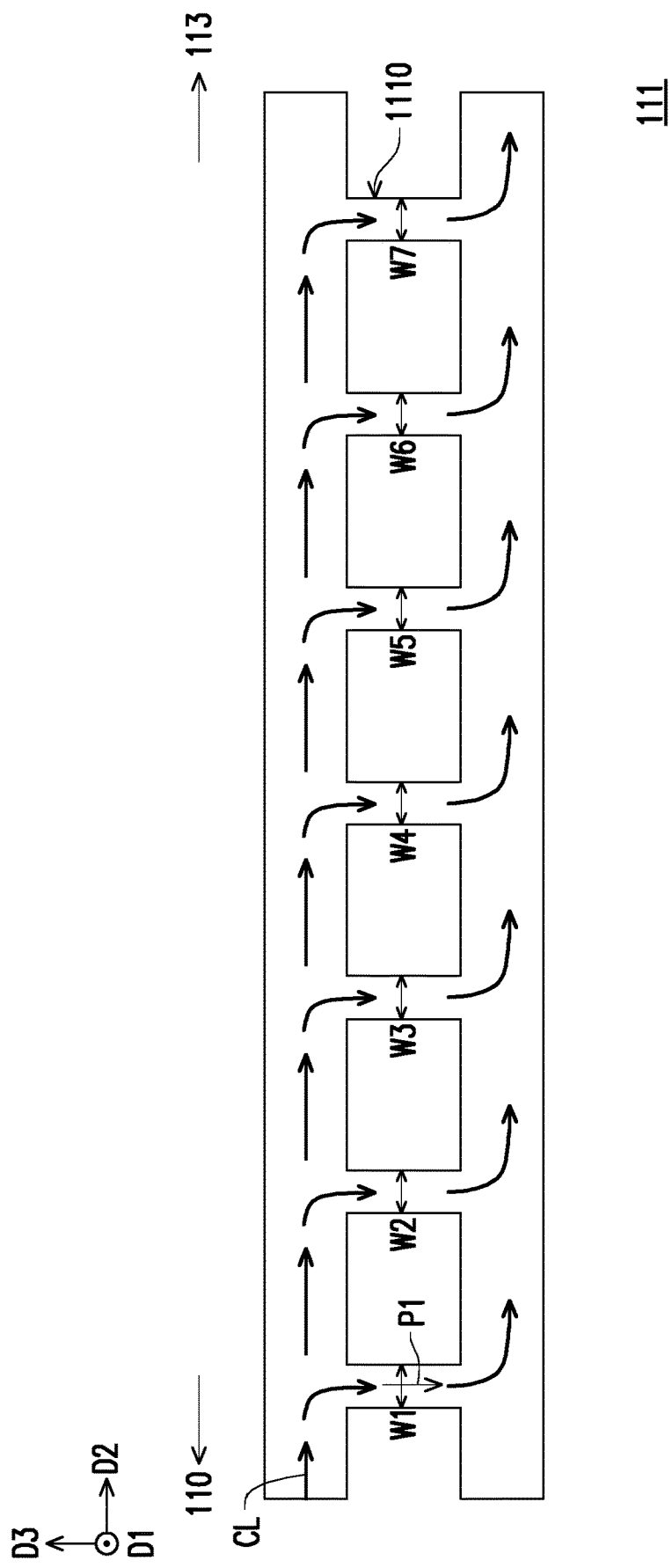
FIG. 1E schematically illustrates a cross-sectional view of a base plate of the heat dissipation substrate in FIG. 1C.

FIG. 1A schematically illustrates a cross-sectional view of a package structure in accordance with some embodiments of the present disclosure. FIG. 1B schematically illustrates a top view of the package structure in FIG. 1A. FIG. 1C schematically illustrates a stereo view of a heat dissipation substrate in FIG. 1B. FIG. 1D schematically illustrates a detailed top view of the heat dissipation substrate in FIG. 1C. FIG. 1E schematically illustrates a cross-sectional view of a base plate of the heat dissipation substrate in FIG. 1C.

Referring to FIG. 1A, a package structure 1 including a reconstructed wafer 10, a heat dissipation substrate 11, a semiconductor device 12, and a fixing mechanism 13 is provided.

In some embodiments, the reconstructed wafer 10 is a wafer form structure including a plurality of semiconductor dies or integrated circuit dies 100, an insulating encapsulation (e.g., a molding compound) 101, a redistribution layer (RDL) 102, and a plurality of conductive terminals 103.

The integrated circuit dies 100 are arranged, for example, in array. In some embodiments, the integrated circuit dies 100 includes a semiconductor substrate (not shown), an interconnection structure (not shown) formed on the semiconductor substrate, a passivation layer (not shown) formed on the interconnection structure, a plurality of bump pads (not shown) formed on the passivation layer and electrically connected to the interconnection structure, a post passivation layer (not shown) covering the passivation layer and the bump pads, and a plurality of conductive pillars (not shown) formed on the post passivation layer and electrically connected to the bump pads.

The semiconductor substrate may be a silicon substrate including active components (e.g., transistors or the like) and passive components (e.g., resistors, capacitors, inductors or the like) formed therein. The interconnection structure may include a plurality of interconnect wiring layers and a plurality of dielectric layers stacked alternately. The passivation layer covers the interconnection structure and includes a plurality of contact openings such that the topmost interconnect wiring layers of the interconnection structure are exposed through the contact openings of the passivation layer. In some embodiments, the passivation layer is a silicon oxide layer, a silicon nitride layer, a silicon oxynitride layer or a dielectric layer formed by other suitable dielectric materials. The bump pads are formed in the contact openings of the passivation layer and electrically connected to the topmost interconnect wiring layers of the interconnection structure through the contact opening of the passivation layer. In some embodiments, the bump pads are aluminum pads, copper pads or other suitable metal pads. The post passivation layer may include a plurality of contact openings such that the bump pads are partially exposed by the contact openings of the post passivation layer. In some embodiments, the post passivation layer is a polyimide (PI) layer, a polybenzoxazole (PBO) layer, or a dielectric layer formed by other suitable polymers. The integrated circuit dies 100 may be electrically connected to the redistribution layer 102 through the conductive pillars. In some embodiments, the conductive pillars are plated copper pillars or other suitable conductive pillars.

The insulating encapsulation 101 encapsulates the side surfaces of the integrated circuit dies 100. In some embodiments, the insulating encapsulation 101 is formed by a molding process (e.g., over-molding process) followed by a grinding process (e.g., mechanical grinding process and/or chemical mechanical polishing process), but other methods for forming the insulating encapsulation 101 are within the contemplated scope of the disclosure. The grinding process is utilized to partially remove the molding compound of the insulating encapsulation to reveal the conductive pillars of the integrated circuit dies 100 so that the conductive pillars of the integrated circuit dies 100 may be connected to the redistribution layer 102.

The redistribution layer 102 is disposed on active surfaces of the integrated circuit dies 100 and a bottom surface of the insulating encapsulation 101. The redistribution layer 102 may include a plurality of conductive layers (not shown) and a plurality of dielectric layers (not shown) stacked alternately. In some embodiments, the conductive layers include a plurality of conductive lines and a plurality of conductive vias formed of one or more metal materials (e.g., copper (Cu), gold (Au), alloys thereof and the like). The dielectric layers may be formed of any suitable dielectric materials such as polybenzoxazole (PBO), polyimide or a polyimide derivative.

The conductive terminals 103 are disposed on and electrically connected to the redistribution layer 102. In some embodiments, the conductive terminals 103 are micro bumps, but other types of the conductive terminals 103 are within the contemplated scope of the disclosure.

The heat dissipation substrate 11 is disposed on a side (e.g., a rear side) of the reconstructed wafer 10. In some embodiments, as shown in FIG. 1B, the package structure 1 includes more than one heat dissipation substrates 11 (e.g., three heat dissipation substrates 11), but the number of the heat dissipation substrates 11 is not intended to be limiting.

The heat dissipation substrate 11 may be a heat sink formed from materials exhibiting high thermal conductivity such as aluminum, copper, other metals, alloys, combinations thereof, and the like, and aids in the cooling of the reconstructed wafer 10 not only by increasing a given surface area to be exposed to a cooling agent (such as air) surrounding it, but also by allowing a coolant CL (shown in FIG. 1E) flowing therein. In other words, the heat dissipation mechanisms in the disclosure may include convection, conduction, and radiation. In some embodiments, the coolant CL (shown in FIG. 1E) is refrigerant, water or other suitable fluid.

Referring to FIG. 1A to FIG. 1D, the heat dissipation substrate 11 includes an inlet 110 through which the coolant CL enters the heat dissipation substrate 11, a base plate 111 located between the inlet 110 and the reconstructed wafer 10 and thermally coupled to the integrated circuit dies 100 of the reconstructed wafer 10, and a connection member 112 located and coupled between the inlet 110 and the base plate 111. In some embodiments, the heat dissipation substrate 11 further includes an outlet 113 coupled to the base plate 111 and through which the coolant CL exits the heat dissipation substrate 11.

The coolant CL enters the heat dissipation substrate 11 through the inlet 110 and then flows to the base plate 111 through the connection member 112. The coolant CL flowing to the base plate 111 flows from the inlet side towards the outlet side and flows through the base plate 111 thermally coupled to the integrated circuit dies 100 before exiting the heat dissipation substrate 11 via the outlet 113, thereby carrying away the heat generated by the integrated circuit dies 100.

The connection member 112 of the heat dissipation substrate 11 has an inclined fluid channel 1120 that descends from the inlet 110 to the base plate 111. In some embodiments, the inclined fluid channel 1120 is a plate-like structure with an acute angle θ included between the base plate 111 and the inclined fluid channel 1120 being greater than 0° and less than 90°, i.e., 0°<θ<90°. However, other forms of the inclined fluid channel 1120 are within the contemplated scope of the disclosure.

In some embodiments, an end E1120 of the inclined fluid channel 1120 that is connected to the base plate 111 is located between the inlet 110 and the outlet 113. For example, as shown in FIG. 1D, the end E1120 of the inclined fluid channel 1120 is located over portions of the integrated circuit dies 100 (e.g., the integrated circuit dies 100E and 100F). In other embodiments, the end E1120 of the inclined fluid channel 1120 is located over other integrated circuit dies 100 (e.g., the integrated circuit dies 100C and 100D, or the integrated circuit dies 100G and 100H) located between the inlet 110 and the outlet 113.

In a heat dissipation substrate in which an inlet is coupled to a base plate without an inclined fluid channel connected between the inlet and the base plate, since the number of integrated circuit dies over which the coolant flows increases as the distance from the inlet increases, the temperature of the coolant increases as the distance from the inlet increases. The higher the temperature of the coolant, the less heat is carried away by the coolant and thereby the less the temperature drop of the integrated circuit dies. Since the temperature drop of the integrated circuit dies near the inlet is greater than the temperature drop of the integrated circuit dies away from the inlet, the heat dissipation effect using the heat dissipation substrate without an inclined fluid channel to dissipate heat is not uniform.

On the other hand, in the heat dissipation substrate 11 in which the inclined fluid channel 1120 is connected between the inlet 110 and the base plate 111, the inclined fluid channel 1120 aids in the increase in the number of fluid channels between the inlet 110 and the base plate 111, the increase in the flow rate of the coolant CL flowing in the heat dissipation substrate 11, the decrease in the temperature of the integrated circuit dies 100 thermally coupled to the base plate 111, and the increase in the uniformity of temperature of the integrated circuit dies 100. Where the end E1120 of the inclined fluid channel 1120 connected to the base plate 111 is located between the inlet 110 and the outlet 113, the temperature of the coolant CL flowing in the inclined fluid channel 1120 is barely influenced by the integrated circuit dies 100A to 100D located below the inclined fluid channel 1120. As a result, the temperature of the coolant CL flowing to the base plate 111 located over the integrated circuit dies 100E to 100J can be lowered by the coolant CL flowing from the inclined fluid channel 1120, thereby improving the uneven heat dissipation issue.

In some embodiments in which the package structure 1 includes multiple heat dissipation substrates 11, as shown in FIG. 1B, the multiple heat dissipation substrates 11 are arranged along a first direction D1 on the reconstructed wafer 10. Each heat dissipation substrate 11 may be overlapped with multiple integrated circuit dies 100 (e.g., 10 integrated circuit dies 100 as shown in FIG. 1D) of the reconstructed wafer 10 along a normal direction D3 of the reconstructed wafer 10. The inlet 110 and the outlet 113 of at least one of the multiple heat dissipation substrates 11 (or each one of the multiple heat dissipation substrates 11) may be arranged along a second direction D2 different from the first direction D1. In some embodiments, the second direction D2 is perpendicular to the first direction D1, but not limited thereto. The inlets 110 and the outlets 113 of the multiple heat dissipation substrates 11 may be alternatively arranged along the first direction D1 to further increase the uniformity of temperature of the integrated circuit dies 100 in the package structure 1.

In some embodiments, the connection member 112 further includes a plurality of longitudinal fluid channels 1121 (e.g., two longitudinal fluid channels 1121) coupled between the inclined fluid channel 1120 and the base plate 111 and substantially perpendicular to the base plate 111. The longitudinal fluid channels 1121 being substantially perpendicular to the base plate 111 refers to that the longitudinal fluid channels 1121 are perpendicular to or almost perpendicular to the base plate 111. In some embodiments, an angle included between the base plate 111 and the longitudinal fluid channel 1121 is 90°±3°, i.e., 87°≤the angle≤93°. The ±3° difference may be resulted from the manufacturing deviation or design requirement.

In some embodiments, the longitudinal fluid channels 1121 are located below the inlet 110 and arranged along the first direction D1 on the base plate 111. Moreover, the integrated circuit dies 100 (e.g., the integrated circuit dies 100A to 100J) covered by the heat dissipation substrate 11 and located between the inlet 110 and the outlet 113 are not overlapped with the longitudinal fluid channels 1121 along the normal direction D3. However, the arrangement or the number of the longitudinal fluid channels 1121 are not intended to be limiting. In other embodiments, the longitudinal fluid channels 1121 are arranged along both the first direction D1 and the second direction D2. Moreover, the longitudinal fluid channels 1121 located between the inlet 110 and the end E1120 of the inclined fluid channel 1120 may be at least partially overlapped with the integrated circuit dies 100 covered by the inclined fluid channel 1120 (e.g., the integrated circuit dies 100A to 100D). The increase of the longitudinal fluid channels 1121 arranged along the second direction D2 further aids in the decrease in the temperature of the integrated circuit dies 100 thermally coupled to the base plate 111 and the increase in the uniformity of temperature of the integrated circuit dies 100.

In some embodiments, as shown in FIG. 1E, the base plate 111 includes a plurality of fluid channels 1110 (e.g., seven fluid channels 1110) arranged from the inlet 110 to the outlet 113. In some embodiments, widths (e.g., widths W1 to W7) of the fluid channels 1110 along a direction (e.g., the second direction D2 in FIG. 1E) substantially perpendicular to transmission paths P of the coolant CL flowing in the fluid channels 1110 increase from the inlet 110 to the outlet 113 to keep the flow or flow rate of the coolant CL in different regions consistent. In some embodiments, widths W1 to W7 of the fluid channels 1110 are about 3 mm to 20 mm, and lengths (dimension of the fluid channels 1110 along the first direction D1) of the fluid channels 1110 are about 5 mm to 100 mm.

Referring back to FIG. 1A, the semiconductor device 12 is disposed on another side (e.g., a front side) of the reconstructed wafer 10, wherein the heat dissipation substrate 11 and the semiconductor device 12 are respectively located on opposite sides of the reconstructed wafer 10. In some embodiments, the semiconductor device 12 includes a socket module 120 and a plurality of module packages 121.

The socket module 120 is electrically connected between the reconstructed wafer 10 and the module packages 121. In some embodiments, the socket module 120 includes a plurality of external connections 1200, which in some embodiments are pins such as pogo pins including ground pins and signal pins, and which are used, for example, to probe one or more devices under test (DUT). The external connections 1200 are connected between the module packages 121 and the conductive terminals 103 of the reconstructed wafer 10.

The module packages 121 are bonded to the socket module 120. In some embodiments, the module packages 121 include memory, flash, power chip, power module, converter, sensor, logic die, interposer and so on that can work in conjunction with the reconstructed wafer 10 in order to provide a desired functionality to the user. In some embodiments, the module packages 121 are in contact with the external connections 1200 in the reconstructed wafer 10, and the socket module 120 may be omitted.

The fixing mechanism 13 fixes the reconstructed wafer 10, the heat dissipation substrate 11, and the semiconductor device 12 together. In some embodiments, the fixing mechanism 13 includes, for example, screws that extend through the reconstructed wafer 10 to the base plate 111 of the heat dissipation substrate 11. As such, the heads of the fixing mechanism 13 pull the reconstructed wafer 10 towards the heat dissipation substrate 11 as the fixing mechanism 13 are tightened, for example, by rotation of the threaded ends of the fixing mechanism 13 within the base plate 111 of the heat dissipation substrate 11. Although the fixing mechanism 13 are characterized as screws in FIG. 1A, any suitable fixing mechanisms (e.g., clamps) may be used to attach the reconstructed wafer 10 to the heat dissipation substrate 11.

In some embodiments, the package structure 1 further includes a bonding layer 14 disposed between the heat dissipation substrate 11 and the reconstructed wafer 10. The bonding layer 14 is, for example, formed from a thermal interface material (TIM) which is used to improve thermal conduction. In some embodiments, the bonding layer 14 is a viscous, silicone compound similar to the mechanical properties of a grease or a gel. In some embodiments the bonding layer 14 is a metal-based thermal paste containing silver, nickel, or aluminum particles suspended in the silicone grease. In some embodiments, non-electrically conductive, ceramic-based pastes, filled with ceramic powders such as beryllium oxide, aluminum nitride, aluminum oxide, or zinc oxide, are applied. In some embodiments, instead of being a paste with a consistency similar to gels or greases, the bonding layer 14 is a solid material. In some embodiments, the bonding layer 14 is a thin sheet of a thermally conductive, solid material. In some embodiments, the bonding layer 14 that is solid is a thin sheet of indium, nickel, silver, aluminum, combinations and alloys of these, or the like, or other thermally conductive solid material. Any suitably thermally conductive material may also be utilized, and all such materials are fully intended to be included within the scope of the embodiments.

Figure 2:
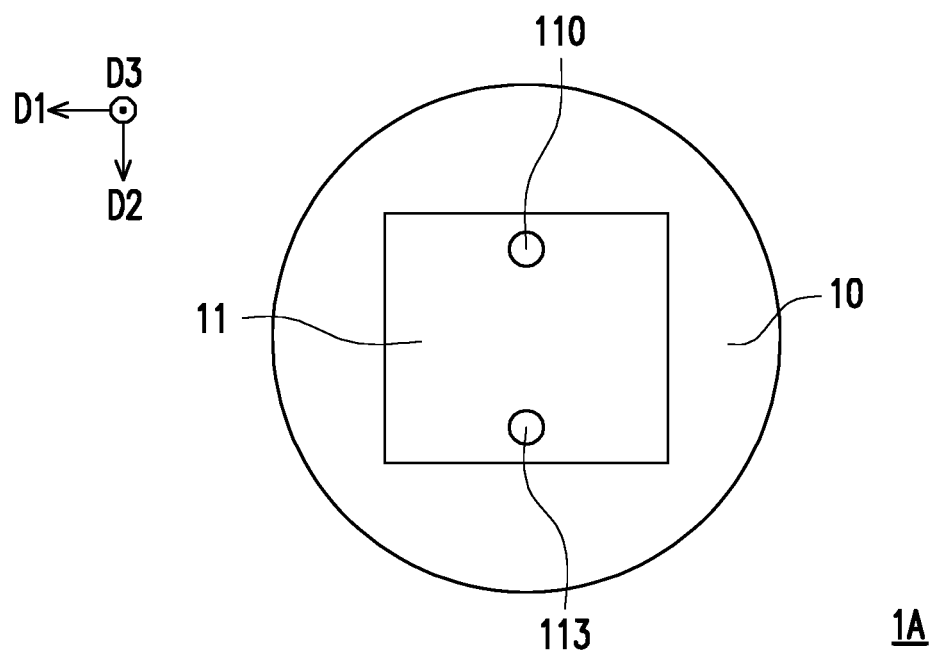
FIG. 2 schematically illustrates a top view of a package structure in accordance with some embodiments of the present disclosure.

FIG. 2 schematically illustrates a top view of a package structure in accordance with some embodiments of the present disclosure. As shown in FIG. 2, a package structure 1A may have one heat dissipation substrate 11 disposed on the reconstructed wafer 10 and overlapped with at least a portion of the integrated circuit dies 100 in the reconstructed wafer 10 along the normal direction D3 of the reconstructed wafer 10. FIG. 2 schematically illustrates that the shape and size of the heat dissipation substrate 11 are different from those of the reconstructed wafer 10. However, all shapes and sizes of the heat dissipation substrate 11 are fully intended to be included within the scope of the embodiments.

Figure 3:
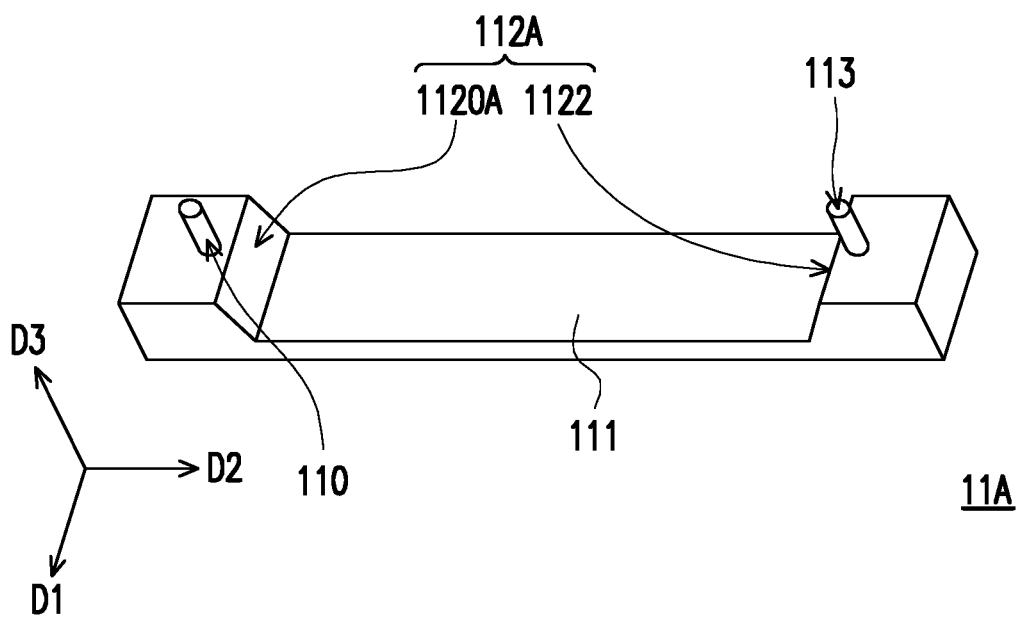
FIG. 3 schematically illustrates a stereo view of a heat dissipation substrate in accordance with some embodiments of the present disclosure.

FIG. 3 schematically illustrates a stereo view of a heat dissipation substrate in accordance with some embodiments of the present disclosure. As shown in FIG. 3, a heat dissipation substrate 11A may include a connection member 112A in addition to the inlet 110, the base plate 111, and the outlet 113 described above. The connection member 112A may further include an inclined fluid channel 1120A and an inclined fluid channel 1122.

The inclined fluid channel 1120A is coupled between the inlet 110 and the base plate 111 and descending from the inlet 110 to the base plate 111. The inclined fluid channel 1122 is coupled between the outlet 113 and the base plate 111 and descending from the outlet 113 to the base plate 111. In some embodiments, the inclined fluid channel 1120A is a block-like structure having an inclined surface facing the outlet 113, and the inclined fluid channel 1122 is a block-like structure having an inclined surface facing the inlet 110. In some embodiments, the inclined surface of the inclined fluid channel 1120A and the inclined surface of the inclined fluid channel 1122 have the same or different slopes. In some embodiments, the heat dissipation substrates 11 in FIG. 1A is replaced by one or more heat dissipation substrates 11A. Where more than one heat dissipation substrates 11A are disposed on the reconstructed wafer 10, the inlets 110 and the outlets 113 of the heat dissipation substrates 11A may be arranged as illustrated in FIG. 1B to further increase the uniformity of temperature of the integrated circuit dies 100 in the package structure 1.

Figure 4:
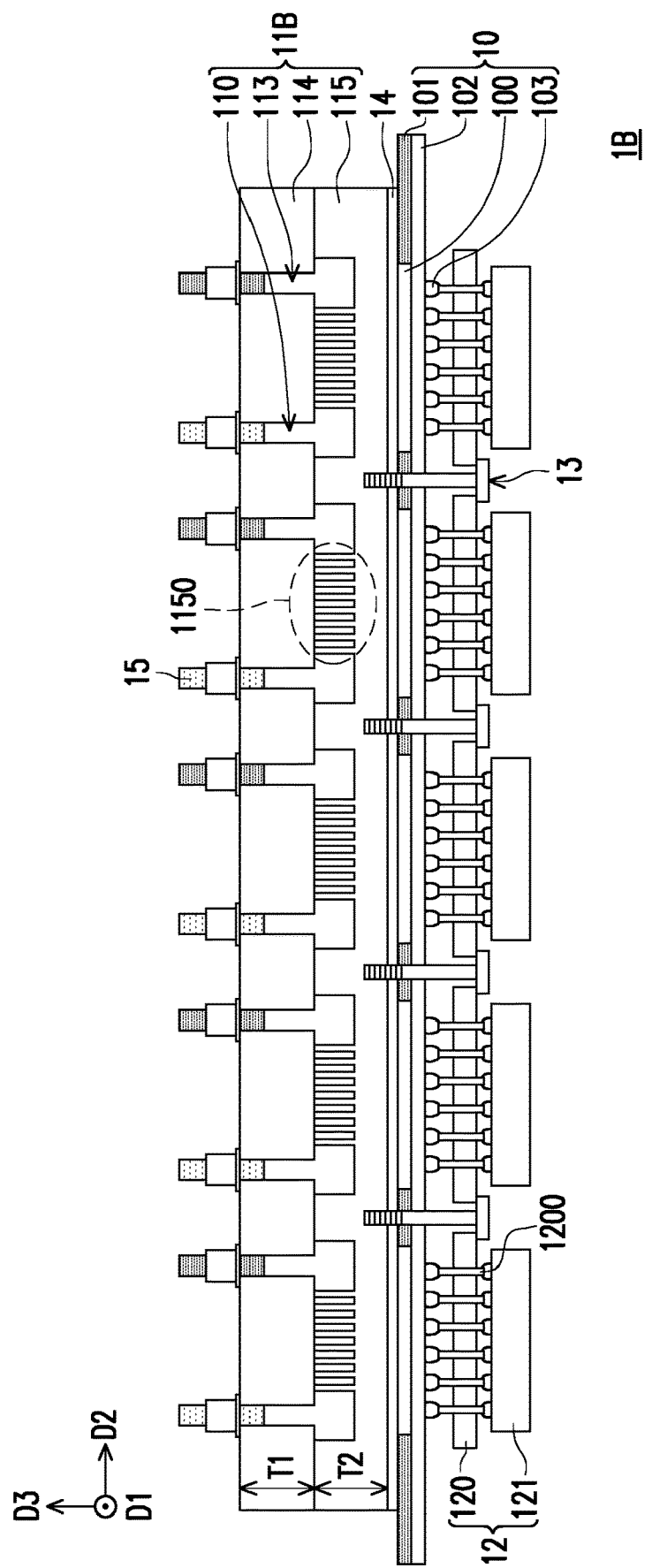
FIG. 4 schematically illustrates a cross-sectional view of a package structure in accordance with some embodiments of the present disclosure.

FIG. 4 schematically illustrates a cross-sectional view of a package structure in accordance with some embodiments of the present disclosure. As shown in FIG. 4, a package structure 1B may include a heat dissipation substrate 11B in addition to the reconstructed wafer 10, the semiconductor device 12, the fixing mechanism 13, and the bonding layer 14 described above. The heat dissipation substrate 11B may include a first substrate 114 and a second substrate 115 in addition to the inlet 110 and the outlet 113 described above. The second substrate 115 is located between the first substrate 114 and the reconstructed wafer 10 and includes a plurality of fluid channels 1150.

In some embodiments, the first substrate 114 and the second substrate 115 are wafers. For example, the first substrate 114 and the second substrate 115 are formed from a variety of semiconductor substrate materials such as silicon (Si), silicon carbide (SiC), gallium arsenide (GaAs), gallium nitride (GaN), ceramic, or the like. In some embodiments, thicknesses T1 and T2 of the first substrate 114 and the second substrate 115 are about 750 µm or about 1 mm to 3 mm. In some embodiments, the first substrate 114 and the second substrate 115 are thicker to increase the heat that can be taken away by the heat dissipation substrate 11B.

In some embodiments, the first substrate 114 is in contact with the second substrate 115. For example, the first substrate 114 is bonded to the second substrate 115 through a fusion bonding process, an anodic bonding process, a hybrid bonding process, or the like. In some embodiments, the first substrate 114 and the second substrate 115 have the same dimension and/or the same shape in a top view of the package structure 1B, but other dimension and/or shapes of the first substrate 114 and the second substrate 115 are within the contemplated scope of the disclosure. Moreover, the dimensions of the first substrate 114 and the second substrate 115 may be the same or different from the dimension of the reconstructed wafer 10 in a top view of the package structure 1B, and the shapes of the first substrate 114 and the second substrate 115 may be the same or different from the shape of the reconstructed wafer 10 in a top view of the package structure 1B.

In some embodiments, the inlet 110 and the outlet 113 are located in the first substrate 114 and coupled to at least one of the plurality of fluid channels 1150. In some embodiments, the number of the inlet 110 in the first substrate 114 is multiple, and the number of the outlet 113 in the first substrate 114 is multiple, and the fluid channels 1150 are coupled to the multiple inlets 110 and the multiple outlets 113. In some embodiments, one fluid channel 1150 is coupled between one inlet 110 and one outlet 113, such that the coolant (not shown in FIG. 4) entering from the inlet 110 flows through the fluid channel 1150 and then outputs from the outlet 113. However, other arrangement of the fluid channels 1150, the multiple inlets 110, and the multiple outlets 113 are within the contemplated scope of the disclosure.

In some embodiments, a material of the bonding layer 14 includes thermal interface materials (TIM), the fixing mechanism 13 includes a plurality of screws, and the screws penetrate the reconstructed wafer 10 and the bonding layer 14 and are screwed in the heat dissipation substrate 11B. In some embodiments, the fixing mechanism 13 are screwed in the second substrate 115, but the depth of the fixing mechanism 13 screwed in the heat dissipation substrate 11B is not intended to be limiting.

In some embodiments, the package structure 1B further includes a plurality of tubes 15 installed in the multiple inlets 110 and the multiple outlets 113 to facilitate the transfer of the coolant.

Figure 5A:
FIG. 5A to FIG. 5E schematically illustrate a process flow for fabricating the package structure in FIG. 4.
Figure 5B:
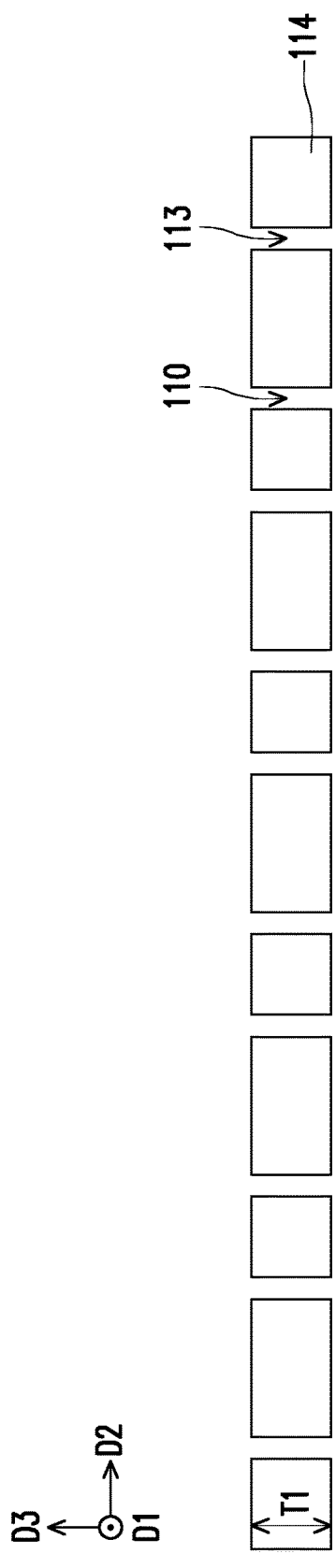
Figure 5C:
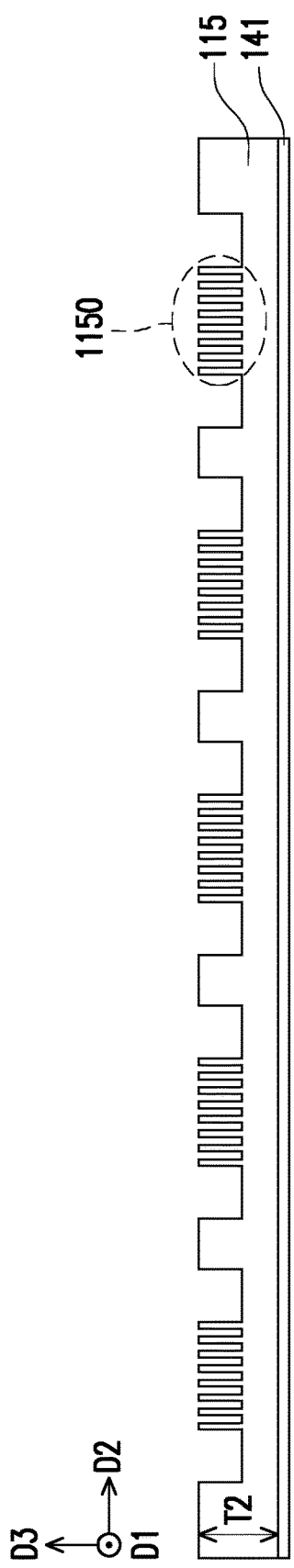
Figure 5D:
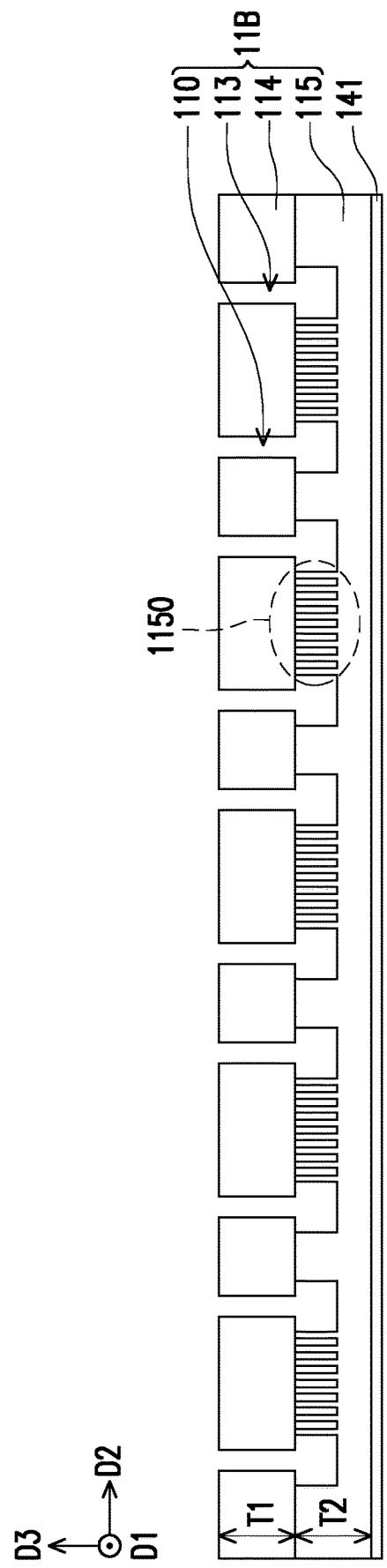
Figure 5E:
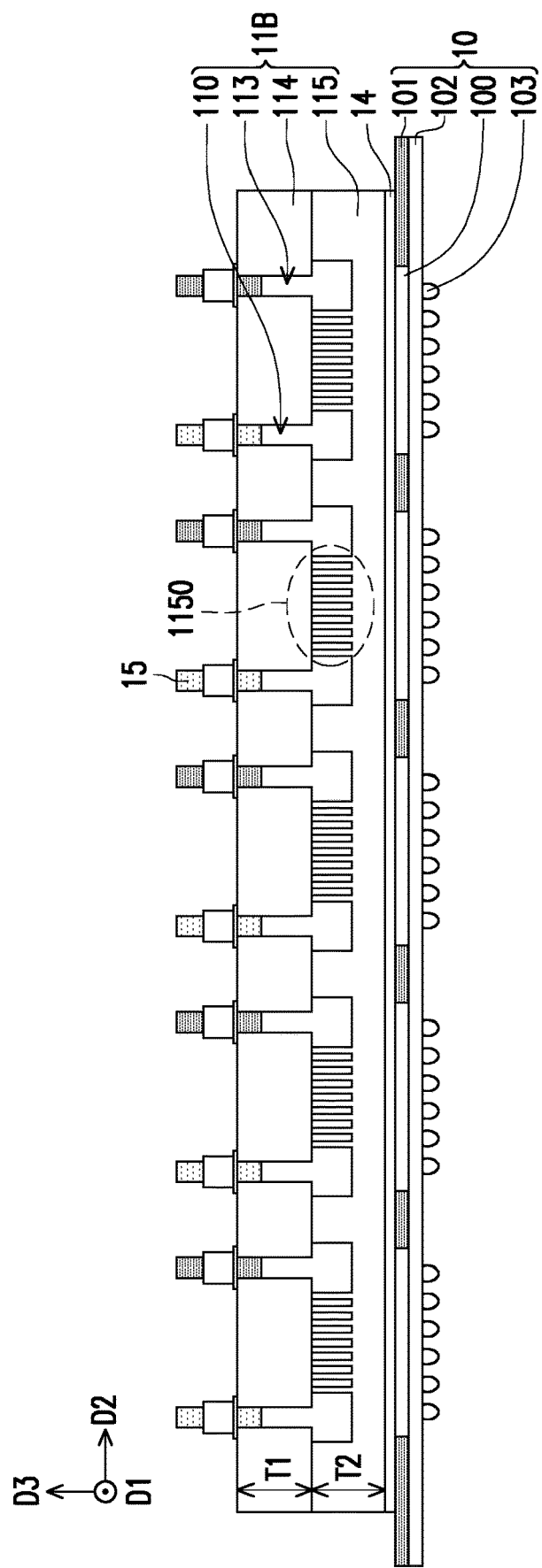

FIG. 5A to FIG. 5E schematically illustrate a process flow for fabricating the package structure in FIG. 4. In FIG. 5A, a bonding material (e.g., a thermal interface material) 140 is formed on the reconstructed wafer 10. In FIG. 5B, the first substrate 114 is formed by creating a plurality of through-silicon via (TSV) (i.e., the multiple inlets 110 and the multiple outlets 113) in a semiconductor substrate. In some embodiments, the through-silicon via are formed by dry etching, but other methods for forming the through-silicon via are within the contemplated scope of the disclosure. In FIG. 5C, the second substrate 115 is formed by creating a plurality of fluid channels 1150 in a semiconductor substrate, and a bonding material (e.g., a thermal interface material) 141 is formed on a rear surface of the second substrate 115. In some embodiments, the fluid channels 1150 are formed by dry etching, but other methods for forming the fluid channels 1150 are within the contemplated scope of the disclosure. In FIG. 5D, the first substrate 114 is bonded to the second substrate 115 through a bonding process such as a fusion bonding process, an anodic bonding process, a hybrid bonding process, or the like. In FIG. 5E, the tubes 15 are installed in the multiple inlets 110 and the multiple outlets 113, and the bonding material 141 in FIG. 5D is bonded to the bonding material 140 in FIG. 5A through a bonding process to form the bonding layer 14. In some embodiments, the bonding process is a fusion bonding process, an anodic bonding process, a hybrid bonding process, or the like. Afterwards, as shown in FIG. 4, the semiconductor device 12 is bonded to the reconstructed wafer 10. Moreover, the reconstructed wafer 10, the heat dissipation substrate 11B, the semiconductor device 12, and the bonding layer 14 are fastened by the fixing mechanism 13. In other embodiments, the sequence of the steps described above are changed, and other methods for forming the package structure in FIG. 4 are within the contemplated scope of the disclosure.

Figure 6:
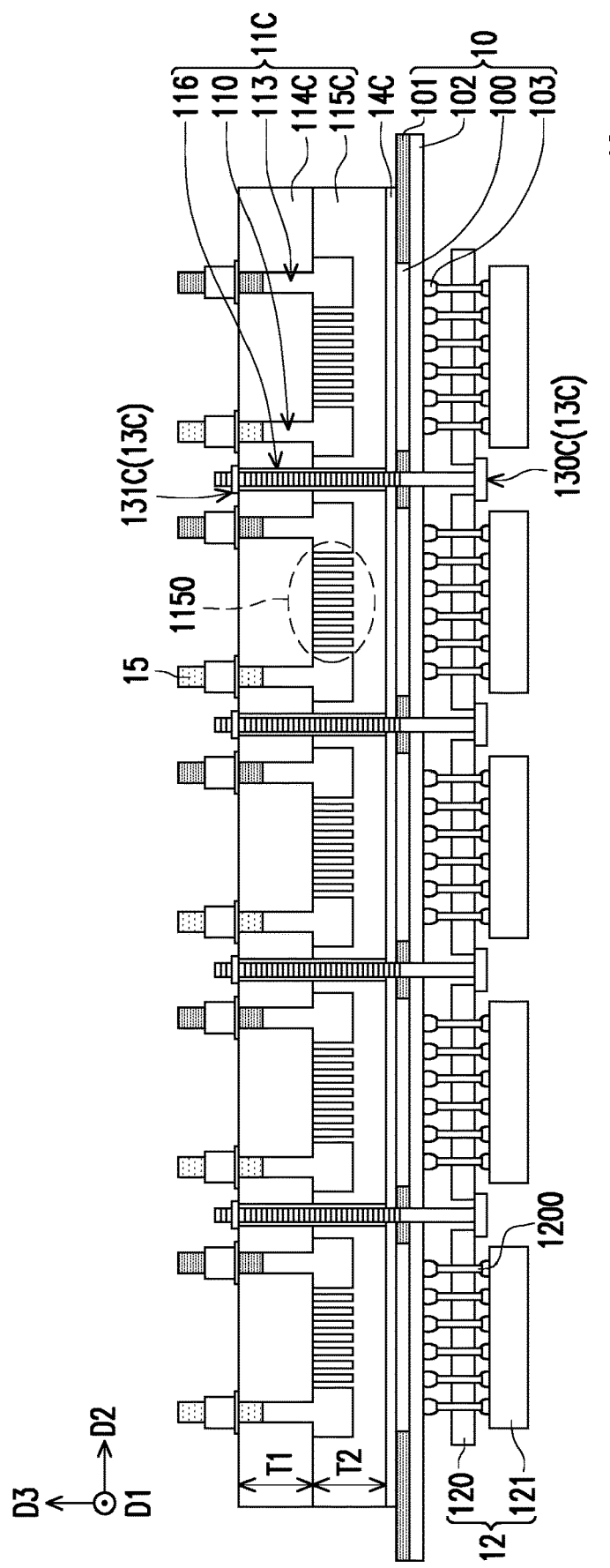
FIG. 6 schematically illustrates a cross-sectional view of a package structure in accordance with some embodiments of the present disclosure.

FIG. 6 schematically illustrates a cross-sectional view of a package structure in accordance with some embodiments of the present disclosure. As shown in FIG. 6, a package structure 1C may include a heat dissipation substrate 11C, a fixing mechanism 13C, and a bonding layer 14C in addition to the reconstructed wafer 10, the semiconductor device 12, and the tubes 15 described in FIG. 4. In some embodiments, the bonding layer 14C includes a back side metal layer. In some embodiments, the fixing mechanism 13C includes a plurality of screws 130C and a plurality of nuts 131C. In some embodiments, the heat dissipation substrate 11C includes a plurality of through holes 116, a first substrate 114C, and a second substrate 115C in addition to the inlet 110 and the outlet 113 described above. The through holes 116 penetrate the first substrate 114C and the second substrate 115C. The screws 130C penetrate the heat dissipation substrate 11C via the through holes 116, and the screws 130C are spaced apart from inner walls of the through holes 116. In other words, the screws 130C are spaced apart from the first substrate 114C and the second substrate 115C. In some embodiments, the screws 130C are fixed by the nuts 131C located on the first substrate 114C.

Figure 7:
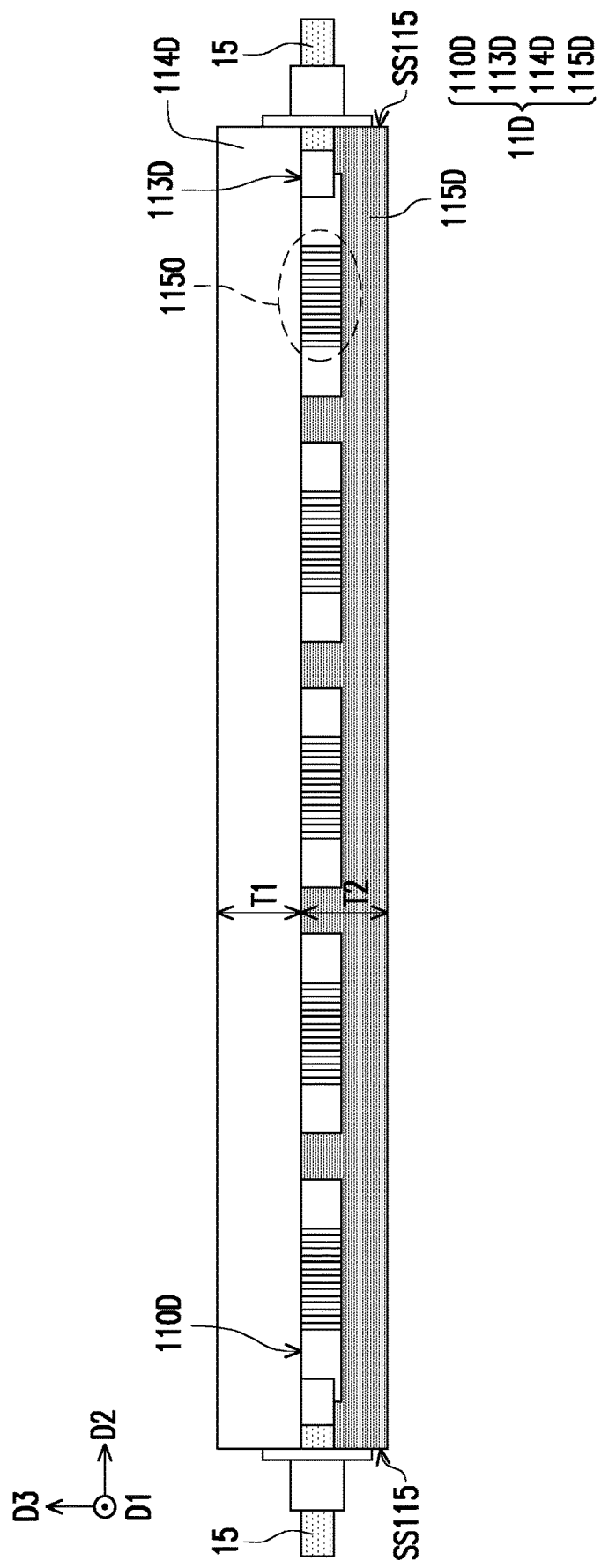
FIG. 7 schematically illustrates a cross-sectional view of a heat dissipation substrate in accordance with some embodiments of the present disclosure.

FIG. 7 schematically illustrates a cross-sectional view of a heat dissipation substrate in accordance with some embodiments of the present disclosure. As shown in FIG. 7, a heat dissipation substrate 11D may include a first substrate 114D and a second substrate 115D, an inlet 110D, and an outlet 113D. In some embodiments, the inlet 110D and the outlet 113D are located in the second substrate 115D and located at two flat side surfaces SS115 of the second substrate 115D, and the fluid channels 1150 are coupled to the inlet 110D and the outlet 113D. In some embodiments, the heat dissipation substrate 11D is a polygon substrate having at least two flat side surfaces. For example, the first substrate 114D and the second substrate 115D are quadrilaterals respectively having four flat side surfaces, and the inlet 110D and the outlet 113D are located at two of the flat side surfaces SS115 of the second substrate 115D. However, other shapes of the first substrate 114D and the second substrate 115D are within the contemplated scope of the disclosure. Moreover, the disposition relationship between the inlet 110D and the outlet 113D and the number of the inlet 110D and the outlet 113D are not intended to be limiting. In some embodiments, the heat dissipation substrate 11B in FIG. 4 or the heat dissipation substrate 11C in FIG. 6 is replaced by the heat dissipation substrate 11D.

Figure 8:
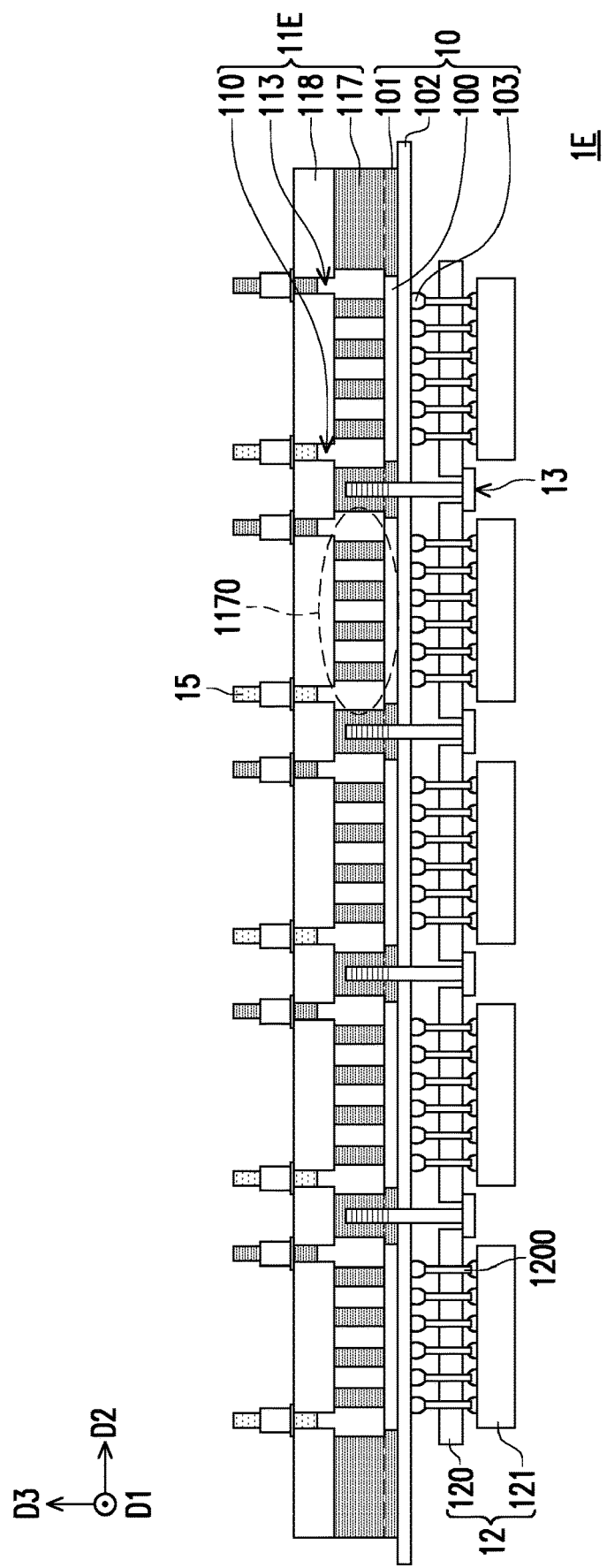
FIG. 8 schematically illustrates a cross-sectional view of a package structure in accordance with some embodiments of the present disclosure.

FIG. 8 schematically illustrates a cross-sectional view of a package structure in accordance with some embodiments of the present disclosure. As shown in FIG. 8, a package structure 1E may include a heat dissipation substrate 11E in addition to the reconstructed wafer 10, the semiconductor device 12, the fixing mechanism 13, and the tubes 15 described above. The heat dissipation substrate 11E may include an insulating encapsulation 117 and a metallic plate 118 in addition to the inlet 110 and the outlet 113 described above.

The insulating encapsulation 117 is located between the metallic plate 118 and the reconstructed wafer 10. In some embodiments, the insulating encapsulation 117 and the insulating encapsulation 101 are formed by multiple molding processes including a first molding process followed by a second molding process. In other embodiments, the insulating encapsulation 117 and the insulating encapsulation 101 are formed by a single molding process followed by a laser drilling process, other methods for forming the insulating encapsulation 117 are within the contemplated scope of the disclosure.

The insulating encapsulation 117 may include a plurality of fluid channels 1170. In some embodiments, the fluid channels 1170 are in contact with the reconstructed wafer 10 to further improve the heat dissipation effect. However, the fluid channels 1170 may not be in contact with the reconstructed wafer 10.

The metallic plate 118 is disposed on the insulating encapsulation 117. In some embodiments, the metallic plate 118 is formed of one or more metal materials (e.g., copper (Cu), gold (Au), aluminum (Al), stainless steel, alloys thereof and the like). In some embodiments, the inlet 110 and the outlet 113 are located in the metallic plate 118 and coupled to the fluid channels 1170. In some embodiments, the number of the inlet 110 in the metallic plate 118 is multiple, and the number of the outlet 113 in the metallic plate 118 is multiple, and the fluid channels 1170 are coupled to the multiple inlets 110 and the multiple outlets 113. In some embodiments, one fluid channel 1170 is coupled between one inlet 110 and one outlet 113, such that the coolant (not shown in FIG. 8) entering from the inlet 110 flows through the fluid channel 1150 and then outputs from the outlet 113. However, other arrangement of the fluid channels 1170, the multiple inlets 110, and the multiple outlets 113 are within the contemplated scope of the disclosure.

Figure 9:
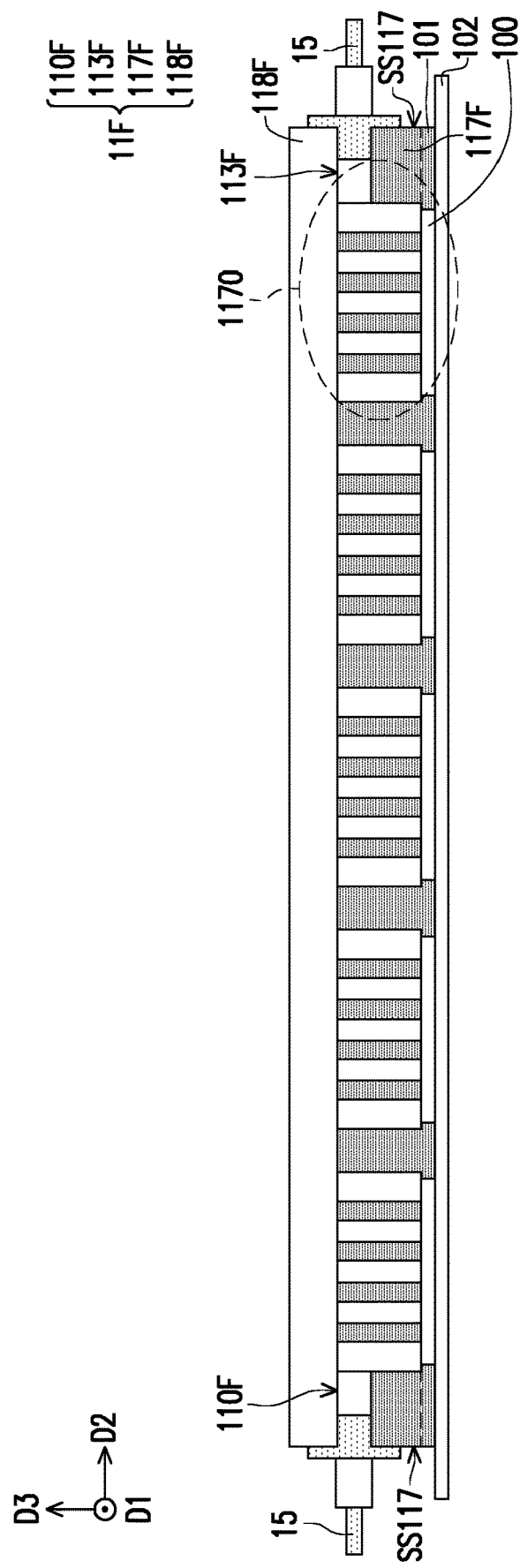
FIG. 9 schematically illustrates a cross-sectional view of a heat dissipation substrate and a part of the reconstructed wafer in accordance with some embodiments of the present disclosure.

FIG. 9 schematically illustrates a cross-sectional view of a heat dissipation substrate and a part of the reconstructed wafer in accordance with some embodiments of the present disclosure. As shown in FIG. 9, a heat dissipation substrate 11F includes an insulating encapsulation 117F, a metallic plate 118F, an inlet 110F, and an outlet 113F. In some embodiments, the inlet 110F and the outlet 113F are located in the insulating encapsulation 117F and located at two side surfaces SS117 of the insulating encapsulation 117F, and the fluid channels 1170 are coupled to the inlet 110F and the outlet 113F. In some embodiments, the heat dissipation substrate 11F is a polygon substrate having at least two flat side surfaces. For example, the insulating encapsulation 117F and the metallic plate 118F are quadrilaterals respectively having four flat side surfaces, and the inlet 110F and the outlet 113F are located at two of the flat side surfaces SS117 of the insulating encapsulation 117F. However, other shapes of the insulating encapsulation 117F and the metallic plate 118F are within the contemplated scope of the disclosure. Moreover, the disposition relationship between the inlet 110F and the outlet 113F and the number of the inlet 110F and the outlet 113F are not intended to be limiting. In some embodiments, the heat dissipation substrate 11E in FIG. 8 is replaced by the heat dissipation substrate 11F.

In an embodiment, a package structure includes a reconstructed wafer, a heat dissipation substrate, a semiconductor device, and a fixing mechanism. The heat dissipation substrate is disposed on a side of the reconstructed wafer and includes an inlet, a base plate located between the inlet and the reconstructed wafer, and a connection member located and coupled between the inlet and the base plate. The connection member has an inclined fluid channel that descends from the inlet to the base plate. The semiconductor device is disposed on another side of the reconstructed wafer, wherein the heat dissipation substrate and the semiconductor device are respectively located on opposite sides of the reconstructed wafer. The fixing mechanism fixes the reconstructed wafer, the heat dissipation substrate, and the semiconductor device together.

In an embodiment, a package structure includes a reconstructed wafer, a heat dissipation substrate, a semiconductor device, and a fixing mechanism. The heat dissipation substrate is disposed on a side of the reconstructed wafer and includes a first substrate and a second substrate. The second substrate is located between the first substrate and the reconstructed wafer and includes a plurality of fluid channels. An inlet and an outlet are located in either the first substrate or the second substrate and coupled to at least one of the plurality of fluid channels. The semiconductor device is disposed on another side of the reconstructed wafer, wherein the heat dissipation substrate and the semiconductor device are respectively located on opposite sides of the reconstructed wafer. The fixing mechanism fixes the reconstructed wafer, the heat dissipation substrate, and the semiconductor device together.

In an embodiment, a package structure includes a reconstructed wafer, a heat dissipation substrate, a semiconductor device, and a fixing mechanism. The heat dissipation substrate is disposed on a side of the reconstructed wafer and includes an insulating encapsulation and a metallic plate disposed on the insulating encapsulation. The insulating encapsulation is located between the metallic plate and the reconstructed wafer and includes a plurality of fluid channels. An inlet and an outlet are located in either the insulating encapsulation or the metallic plate and coupled to at least one of the plurality of fluid channels. The semiconductor device is disposed on another side of the reconstructed wafer, wherein the heat dissipation substrate and the semiconductor device are respectively located on opposite sides of the reconstructed wafer. The fixing mechanism fixes the reconstructed wafer, the heat dissipation substrate, and the semiconductor device together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a reconstructed wafer;
   a heat dissipation substrate disposed on a side of the reconstructed wafer and comprising an inlet, a base plate located between the inlet and the reconstructed wafer, and a connection member located and coupled between the inlet and the base plate, wherein the connection member has an inclined fluid channel that descends from the inlet to the base plate;
   a semiconductor device disposed on another side of the reconstructed wafer, wherein the heat dissipation substrate and the semiconductor device are respectively located on opposite sides of the reconstructed wafer; and
   a fixing mechanism fixing the reconstructed wafer, the heat dissipation substrate, and the semiconductor device together.

2. The package structure as claimed in claim 1, wherein the connection member further comprises a plurality of longitudinal fluid channels coupled between the inclined fluid channel and the base plate and substantially perpendicular to the base plate.

3. The package structure as claimed in claim 1, wherein the heat dissipation substrate further comprises an outlet coupled to the base plate, and wherein an end of the inclined fluid channel that is connected to the base plate is located between the inlet and the outlet.

4. The package structure as claimed in claim 1, wherein the heat dissipation substrate further comprises an outlet coupled to the base plate, the connection member further comprises another inclined fluid channel coupled between the outlet and the base plate and descending from the outlet to the base plate.

5. The package structure as claimed in claim 1, wherein the heat dissipation substrate further comprises an outlet coupled to the base plate, the base plate comprises a plurality of fluid channels arranged from the inlet to the outlet, and widths of the plurality of fluid channels along a direction substantially perpendicular to transmission paths of coolant flowing in the plurality of fluid channels increase from the inlet to the outlet.

6. The package structure as claimed in claim 1, wherein the heat dissipation substrate further comprises an outlet coupled to the base plate, the number of the heat dissipation substrate in the integrated wafer level package with thermal solution is multiple, and the multiple heat dissipation substrates are arranged along a first direction on the reconstructed wafer, the inlet and the outlet of at least one of the multiple heat dissipation substrates are arranged along a second direction different from the first direction, and the inlets and the outlets of the multiple heat dissipation substrates are alternatively arranged along the first direction.

7. The package structure as claimed in claim 1, further comprising:
   a bonding layer disposed between the heat dissipation substrate and the reconstructed wafer.

8. A package structure, comprising:
   a reconstructed wafer;
   a heat dissipation substrate disposed on a side of the reconstructed wafer and comprising a first substrate and a second substrate, wherein the second substrate is located between the first substrate and the reconstructed wafer and comprises a plurality of fluid channels, and wherein an inlet and an outlet are located in either the first substrate or the second substrate and coupled to at least one of the plurality of fluid channels;

a semiconductor device disposed on another side of the reconstructed wafer, wherein the heat dissipation substrate and the semiconductor device are respectively located on opposite sides of the reconstructed wafer; and a fixing mechanism fixing the reconstructed wafer, the heat dissipation substrate, and the semiconductor device together.

9. The package structure as claimed in claim 8, wherein the inlet and the outlet are located in the first substrate, the number of the inlet in the first substrate is multiple, and the number of the outlet in the first substrate is multiple, and the plurality of fluid channels are coupled to the multiple inlets and the multiple outlets.

10. The package structure as claimed in claim 8, wherein the inlet and the outlet are located in the second substrate and located at two flat side surfaces of the second substrate, and the plurality of fluid channels are coupled to the inlet and the outlet.

11. The package structure as claimed in claim 10, wherein the heat dissipation substrate is a polygon substrate having at least two flat side surfaces.

12. The package structure as claimed in claim 8, wherein the first substrate and the second substrate are wafers.

13. The package structure as claimed in claim 8, wherein the first substrate is in contact with the second substrate.

14. The package structure as claimed in claim 8, further comprising:

a bonding layer disposed between the heat dissipation substrate and the reconstructed wafer.

15. The package structure as claimed in claim 14, wherein a material of the bonding layer comprises thermal interface materials, the fixing mechanism comprises a plurality of screws, and the plurality of screws penetrate the reconstructed wafer and the bonding layer and are screwed in the heat dissipation substrate.

16. The package structure as claimed in claim 14, wherein the bonding layer comprises a back side metal layer, the fixing mechanism comprises a plurality of screws, the heat dissipation substrate comprises a plurality of through holes, the plurality of screws penetrate the heat dissipation substrate via the through holes, wherein the plurality of screws are fixed by a plurality of nuts, and the plurality of screws are spaced apart from inner walls of the through holes.

17. A package structure, comprising:

a reconstructed wafer;

a heat dissipation substrate disposed on a side of the reconstructed wafer and comprising an insulating encapsulation and a metallic plate disposed on the insulating encapsulation, wherein the insulating encapsulation is located between the metallic plate and the reconstructed wafer and comprises a plurality of fluid channels, and wherein an inlet and an outlet are located in either the insulating encapsulation or the metallic plate and coupled to at least one of the plurality of fluid channels;

a semiconductor device disposed on another side of the reconstructed wafer, wherein the heat dissipation substrate and the semiconductor device are respectively located on opposite sides of the reconstructed wafer; and a fixing mechanism fixing the reconstructed wafer, the heat dissipation substrate, and the semiconductor device together.

18. The package structure as claimed in claim 17, wherein the plurality of fluid channels are in contact with the reconstructed wafer.

19. The package structure as claimed in claim 17, wherein the inlet and the outlet are located in the metallic plate, the number of the inlet in the metallic plate is multiple, and the number of the outlet in the metallic plate is multiple, and the plurality of fluid channels are coupled to the multiple inlets and the multiple outlets.

20. The package structure as claimed in claim 17, wherein the inlet and the outlet are located in the insulating encapsulation and located at two side surfaces of the insulating encapsulation, and the plurality of fluid channels are coupled to the inlet and the outlet.

* * * * *